US006969953B2

(12) United States Patent
Schaepkens (10) Patent No.: US 6,969,953 B2
(45) Date of Patent: Nov. 29, 2005

(54) SYSTEM AND METHOD FOR INDUCTIVE COUPLING OF AN EXPANDING THERMAL PLASMA

(75) Inventor: Marc Schaepkens, Ballston Lake, NY (US)

(73) Assignee: General Electric Company, Niskayuna, NY (US)

( * ) Notice: Subject to any disclaimer, the term of this patent is extended or adjusted under 35 U.S.C. 154(b) by 0 days.

(21) Appl. No.: 10/609,958

(22) Filed: Jun. 30, 2003

(65) Prior Publication Data

US 2004/0263083 A1 Dec. 30, 2004

(51) Int. Cl.$^7$ .............................. H01J 7/24; C23C 16/00
(52) U.S. Cl. ............................ 315/111.21; 315/111.51; 118/723 MP; 118/723 I
(58) Field of Search ...................... 315/111.21, 111.51, 315/111.71, 111.91; 313/231.31; 118/723 MP, 118/723 IR, 723 I; H01J 7/24; C23C 16/00

(56) References Cited

U.S. PATENT DOCUMENTS

| | | | | |
|---|---|---|---|---|
| 4,828,369 A | * | 5/1989 | Hotomi .................... 359/270 |
| 4,853,250 A | | 8/1989 | Boulos et al. ................ 427/34 |
| 4,871,580 A | | 10/1989 | Schram et al. ................ 427/38 |
| 4,879,011 A | | 11/1989 | Schram ................. 204/157.42 |
| 4,957,062 A | | 9/1990 | Schuurmans et al. ....... 118/723 |
| 5,120,568 A | | 6/1992 | Schuurmans et al. ......... 427/37 |
| 5,681,393 A | | 10/1997 | Takagi ................... 118/723 IR |
| 5,690,781 A | * | 11/1997 | Yoshida et al. ......... 156/345.48 |
| 6,153,852 A | | 11/2000 | Blutke et al. .......... 219/121.59 |
| 6,211,622 B1 | * | 4/2001 | Ryoji et al. ............. 315/111.21 |
| 6,231,725 B1 | | 5/2001 | Nulman et al. ......... 204/192.12 |
| 6,338,313 B1 | * | 1/2002 | Chan ...................... 118/723 I |
| 6,379,576 B2 | * | 4/2002 | Luo et al. ..................... 216/67 |
| 6,397,776 B1 | | 6/2002 | Yang et al. ........... 118/723 MP |
| 6,420,032 B1 | | 7/2002 | Iacovangelo ................ 428/412 |
| 6,426,125 B1 | | 7/2002 | Yang et al. ................. 427/488 |
| 6,517,687 B1 | | 2/2003 | Iacovangelo ........... 264/192.26 |
| 2002/0029747 A1 | | 3/2002 | Powell et al. .......... 118/723 IR |
| 2002/0029850 A1 | * | 3/2002 | Chan ......................... 156/345 |
| 2003/0097988 A1 | | 5/2003 | Schaepkens ......... 118/723 MP |
| 2003/0111963 A1 | | 6/2003 | Tolmachev et al. ..... 315/111.51 |

FOREIGN PATENT DOCUMENTS

WO  WO 03/018867  3/2003

OTHER PUBLICATIONS

Ventzek, Peter et al. "Two-dimensional Modeling of High Plasma Density Inductively Coupled Sources for Materials Processing" J. Vac Sci. Technol. B 12(1), Jan./Feb. 1994.

(Continued)

*Primary Examiner*—Trinh Vo Dinh
(74) *Attorney, Agent, or Firm*—Andrew J. Caruso; William E Powell, III (57) ABSTRACT

A method is provided for generating plasma using a plasma generator system. The method includes the steps of introducing energy and a reactant to a plasma generation apparatus of the plasma generator system for generating plasma, and expanding and inductively coupling the generated plasma. In another embodiment a plasma generation system is provided including a plasma generation apparatus for generating thermal plasma. The thermal plasma is received by a plasma treatment chamber external to the plasma generation apparatus. A pressure control system maintains a lower pressure in the plasma treatment chamber than in the plasma generation apparatus during plasma generation for causing the thermal plasma to expand within the plasma treatment chamber. An inductor system inductively couples the thermal plasma.

15 Claims, 4 Drawing Sheets

OTHER PUBLICATIONS

Hopwood, J. "Electromagnetic fields in a Radio-Frequency Induction Plasma", J. Vac. Sci. Technol. A 11(1), Jan./Feb. 1993.

Ventzek, Peter et al. "Inventigation of Electron Source and Ion Flux Uniformity in High Plasma Density Inductively Coupled Etching Tools Using Two-Dimensional Modeling", J. Vac. Sci. Technol. B 12(6), Nov./Dec. 1994.

Schaepkens, M. "High-Rate Deposition of Abrasion Resistant Coatings Using a Dual-Source Expanding Thermal Plasma Reactor", J. Vac. Sci. Technol. A 21(4), Jul./Aug. 2003.

Van de Sanden, et al. "The Expanding Thermal Arc Plasma: the Low-Flow Regime", Plasma Sources Sci. Technol.; 1998.

* cited by examiner

SYSTEM AND METHOD FOR INDUCTIVE COUPLING OF AN EXPANDING THERMAL PLASMA

FIELD OF THE INVENTION

The present disclosure relates to plasma processing, and particularly to inductive coupling of an expanding thermal plasma.

BACKGROUND OF THE INVENTION

Deposition of coatings on substrates is performed using plasmas, such as thermal plasmas, expanding thermal plasmas (ETPs) and inductive coupling plasmas (ICPs). ETPs are produced by forming a thermal plasma under high pressure in an upstream portion of an ETP source and providing the thermal plasma to a downstream portion of the ETP source. The downstream portion includes a low pressure chamber (having lower pressure than the upstream portion) which receives the thermal plasma and a reagent precursor injection. Inside the low pressure chamber the thermal plasma expands due to the relatively large pressure differential between the downstream and upstream portions of the ETP source. Reagents that are injected into the expanding thermal plasma dissociate due to chemical reactions, such as charge exchange and subsequent dissociative recombination reactions, between the thermal plasma and the reagent.

Coatings deposited by individual ETP sources cover surfaces having a limited width typically less than 30 cm. Accordingly, multiple ETP sources are needed to coat large areas. The distribution of the energy level of the ETP is nonuniform, and is typically Gaussian shaped, resulting in a substantially Gaussian plasma density and a Gaussian deposition thickness profile. However, in most applications a uniform thickness profile for individual ETP sources is desired, particularly when multiple sources are used for coating a single surface.

Furthermore, in ETP sources the energy at which ions bombard electrically floating substrates, such as polymer substrates, is extremely low and uncontrollable. The tendency of ETPs to have low ion energy may interfere with generation of coatings having good adhesion and/or high density.

Attempts have been made to reduce pumping requirements and increase efficiency. These attempts include reducing the diameter orifice in a cascade plate of the ETP source for allowing ETP operation with a reduced plasma gas flow, which in turn reduces the ion flux that is needed for reagent dissociation and reduces deposition rate. Attempts have also been made to increase utilization by using a nozzle injector configured for intensive mixing of reagents and the expanding thermal plasma. However, the nozzle injector substantially confines the plasma, which tends to induce non-uniformities. Attempts have also been made to increase ion energy control by applying an independent bias voltage to the substrate to which deposits are being applied. However, this method does not function when processing electrically floating substrates, such as polymer substrates.

Nonetheless, ETPs have relatively high charged particle densities, relatively low electron temperatures, and maintain an equilibrium between electron temperatures and ion temperatures, resulting in relatively low ion temperatures and bombardment energies, which is desirable for semiconductor applications and the prevention of damage to electronic devices. Although the low electron temperature of ETPs is considered to be advantageous, there exist nonobvious advantages for raising the electron temperature. While ETPs provide a reagent dissociation path based on charge exchange reactions followed by dissociative recombination reactions, which occurs at relatively low electron temperatures, the ETP's Te is too low for providing a reagent dissociation path based on electron impact dissociation reactions.

Each path provides the ability for generation of specific chemical species, and the lack of the electron impact dissociation path limits the type of chemical species that can be generated, which limits contribution to the coating process and decreases efficiency of individual ETP sources. Thus, causing further demands are placed on the pumping process, including increases in gas and energy loads, the number of ETP sources required for large area uniformity and costs.

ICPs, on the other hand, are formed by ICP sources that include a low pressure chamber that receives a reagent precursor injection in a low pressure chamber, where the chamber is provided with at least one coil connected to an energy source. When energy is applied the at least one coil the Te increases and an electron impact dissociation path is achieved. However, ICPs, similar to ETPs, typically do not provide a uniform deposition over large areas. Further, in ICPs charged particle densities are typically low relative to ETPs, which limits the density of reagent fragments formed through dissociation reactions of reagents with energetic electrons, and thus results in low growth rates of coatings.

Higher power ICPs have been attempted for generating higher charged particle densities, but high power stray capacitive power coupling typically develops, causing sputtering of reactor walls, and thus contaminating the coatings that are deposited. Also, as a result of the ICP plasma generation mechanism the electron temperatures are not generally lowered below a certain energy, thus limiting the plasma chemistry that can be achieved with the ICP source.

Accordingly, there is a need for a system and method for uniformly distributing dissociated reagents over the surface of a substrate, thus forming a coating on a substrate.

Furthermore, there is a need for a system and method for efficiently generating a high electron density plasma with a controllable electron temperature, such that ICP like high Tes can be combined with ETP like electron densities, resulting in high growth rates with controllable plasma chemistry based on both charge exchange and dissociative recombination paths and electron impact dissociation paths. Other advantages are described in greater detail below.

BRIEF DESCRIPTION OF THE INVENTION

A method is provided for generating plasma using a plasma generator system. The method includes the steps of introducing energy and a reactant to a plasma generation apparatus of the plasma generator system for generating plasma, and expanding and inductively coupling the generated plasma.

In another embodiment of the invention a plasma generation system is provided including a plasma generation apparatus for generating thermal plasma. The thermal plasma is received by a plasma treatment chamber external to the plasma generation apparatus. A pressure control system maintains a lower pressure in the plasma treatment chamber than in the plasma generation apparatus during plasma generation for causing the thermal plasma to expand within the plasma treatment chamber. An inductor system inductively couples the thermal plasma.

In another embodiment of the invention a plasma generation system is provided including an apparatus for generating a plasma. An apparatus for receiving receives the generated plasma and provides for expansion of the generated plasma. An apparatus for inductively coupling inductively couples the generated plasma, wherein the apparatus for receiving and the apparatus for inductively coupling together form the generated plasma into an inductively coupled and expanded plasma.

In still another embodiment of the invention a plasma generator system is provided including means for generating plasma by introducing energy and a reactant to the plasma generator system; and means for expanding and inductively coupling the generated plasma.

In another embodiment of the invention an expanding inductively coupled plasma is provided. The plasma is generated by the method including the steps of introducing energy and a reactant to a plasma generation apparatus of a plasma generator system for generating plasma; and expanding and inductively coupling the generated plasma.

In another embodiment of the invention an object having at least one surface is provided. The surface is treated using an expanding inductively coupled plasma, where the plasma is generated by the method including the steps of introducing energy and a reactant to a plasma generation apparatus of a plasma generator system for generating plasma; and expanding and inductively coupling the generated plasma.

DESCRIPTION OF THE PREFERRED EMBODIMENT

Figure 1:
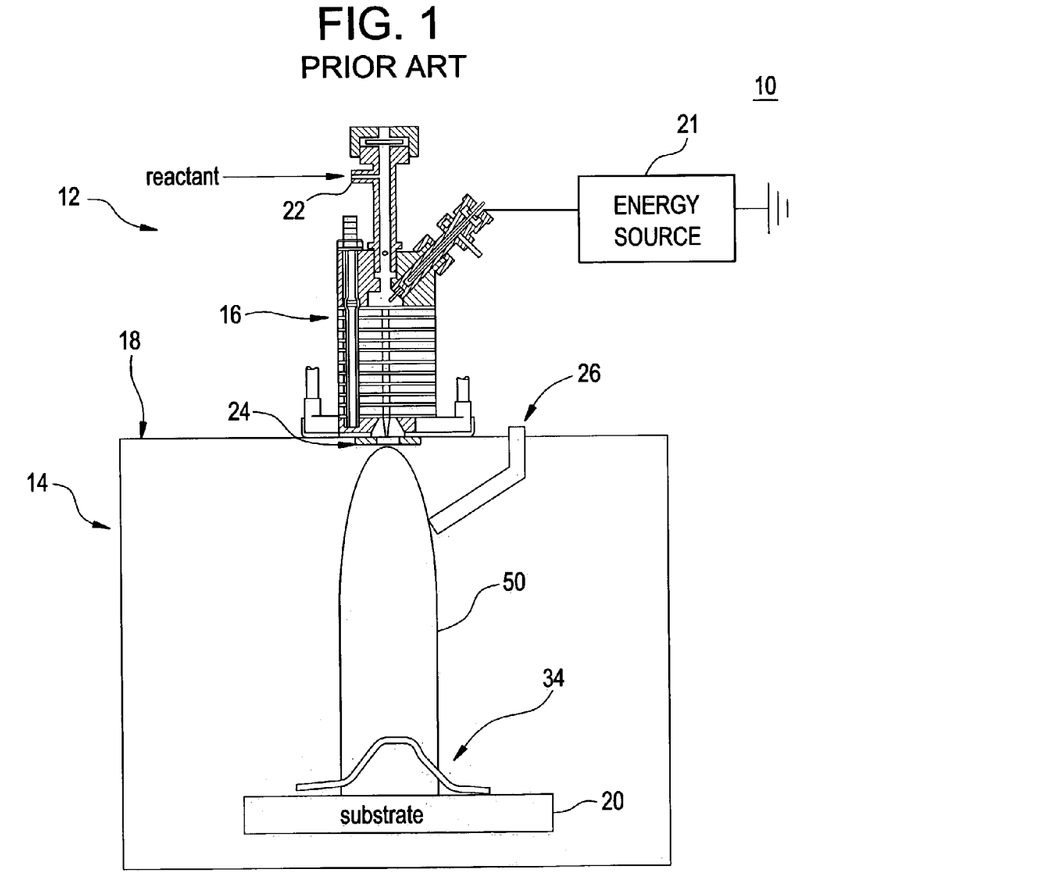
FIG. 1 is a schematic diagram of a prior art ETP reactor.

Superior plasma treatment is achieved in accordance with the present disclosure by combining inductive coupling with an expanding thermal plasma (ETP) system. The results achieved by the combination are superior to either ETPs or inductive coupling plasmas (ICPs) with respect to uniformity of deposition, electron and ion energy control, and efficiency. Shown schematically in FIG. 1 is a conventional ETP reactor 10. The ETP reactor 10 includes an upstream portion 12 and a downstream portion 14, where the upstream portion includes a plasma-generator 16, and the downstream portion 14 includes a chamber 18. The upstream portion 12 is similar to FIG. 2 of U.S. Pat. No. 4,871,580, issued to Schram et al. A substrate 20 is placed within the chamber 18.

The plasma-generator 16 receives a reactant, such as gases including Argon, Xenon, Helium, other noble gases, Nitrogen and/or Hydrogen gas, through an inlet 22. Energy is applied to the plasma generator via an energy source 21, such as for producing arcs and/or discharges within the plasma-generator 16. The arcs and/or discharges act upon the reactant to produce a plasma. Pressure is maintained within the plasma-generator 16 that is suitable for producing a thermal plasma. In an exemplary plasma-generator, ions and electrons of the thermal plasma have a temperature of 1 eV, and the charge density is $10^{15}$ cm$^{-3}$ or higher. The plasma-generator 16 is further provided with a nozzle through which the thermal plasma exits the plasma-generator 16 for passing through an inlet 24 and then into the chamber 18. The chamber 18 is maintained at a pressure that is lower than the pressure maintained in the plasma-generator 16 for allowing the thermal plasma to expand into an expanding thermal plasma 50. In the chamber 18, the ETP 50 cools rapidly and the electrons and ions start to recombine, after which the expansion shocks, i.e., expansion speed goes from supersonic speed to subsonic speed, and the electron temperature (Te) drops, such as to 0.1–0.3 eV, and the charge density is around $10^{12}$ cm$^{-3}$.

A reagent, such as a material formed of gas, liquid and/or solids, e.g., silanes, methanes, other hydrocarbons, fluorocarbons, deuterated carbons, deuterated silanes, alcohols, acrylates, epoxies, organosilanes, chlorosilanes, fluorosilanes, aminosilanes, organosilicones, metal organic precursors, metal chlorides, metal fluorides, water, oxygen, hydrogen, nitrogen, ammonia, carbon dioxide, carbon monoxide or a suitable combination thereof, is injected into the chamber 18 via a port, such as injection inlet 26, causing precursor dissociation to occur mainly through charge exchange and subsequent dissociative recombination reactions between the reactant ions and the reagent ions. The reagent dissociation products are transported along with the expansion at high drift velocity, thus generating a convective flux of reactive species, which arrives at the surface of the substrate 20, resulting in deposition of a coating 34 on the substrate.

The ETP 50 is an equilibrium plasma in which electron temperature substantially equals ion temperature, where the electron temperatures and ion temperatures are relatively low, such as 0.1 eV. Ion density of the ETP 50 has a Gaussian distribution resulting in a coating 34 on the substrate 20 having a Gaussian shaped deposition profile that is non-uniform in thickness and density.

Figure 2:
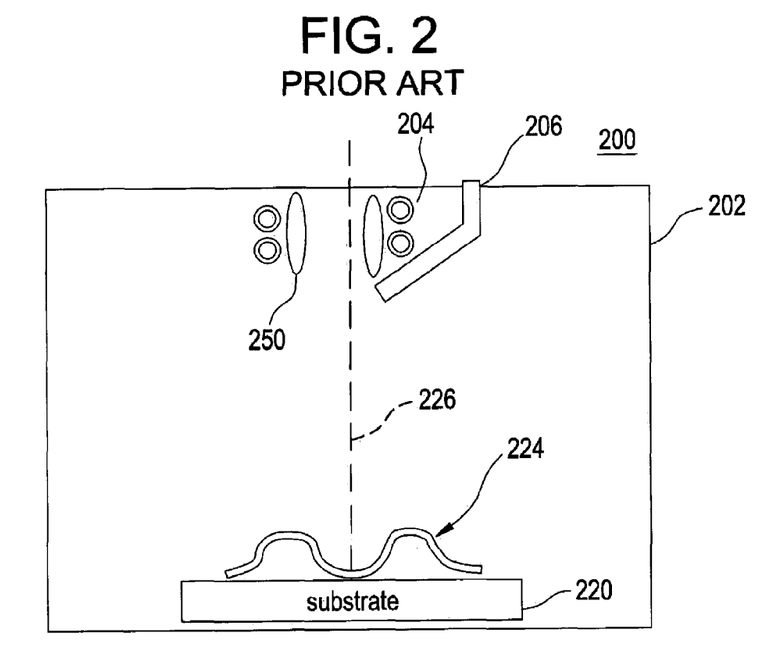
FIG. 2 is a schematic diagram of a prior art ICP reactor.

FIG. 2 shows a conventional ICP reactor 200 having at least one chamber 202 including a vacuum chamber under low pressure conditions, such as under 10 Torr, in communication with a substrate 220 to which a reagent is introduced, through a port 206, such as a ring injector, a shower head or another type of inlet. A reactant gas, such as Argon, Helium or other noble gas, may also be introduced through port 206 or another port (not shown). At least one coil 204 is disposed within the at least one chamber 202, or looped around the at least one chamber 202 or a passageway connected thereto, where typically a portion of a surface with which the at least one coil 204 (particularly when the at least one coil is not insulated) is in contact is formed of a dielectric material.

The at least one coil is connected between ground and a power source (not shown). Energy provided by the power source is applied to the at least one coil 204 for causing an electric discharge, i.e. to generate a plasma. An inductively coupled plasma 250 is thus generated within the chamber 202. Precursor dissociation occurs through an electron impact dissociation path generating a flux of reactive species, which arrives at the surface of the substrate 220 resulting in deposition of a coating 224 on the substrate.

The ICP plasma is a non-equilibrium plasma, where the Te may be significantly higher than the ion temperature, such as where the ion temperature is 0.1 eV and the electron temperature is higher than 1 eV. With the at least one electric coil 204 strategically positioned in an annular formation within the at least one chamber 202, the ion density of the ICP formed has an off axis high (not along axis 226) distribution, typically resulting in the coating 224 having an off-axis high deposition profile on the substrate 220, and the coating 224 being non-uniform in thickness and density.

Specifically, the density and thickness of the coating 224 is increased in an annular area about a central axis 226.

Figure 3:
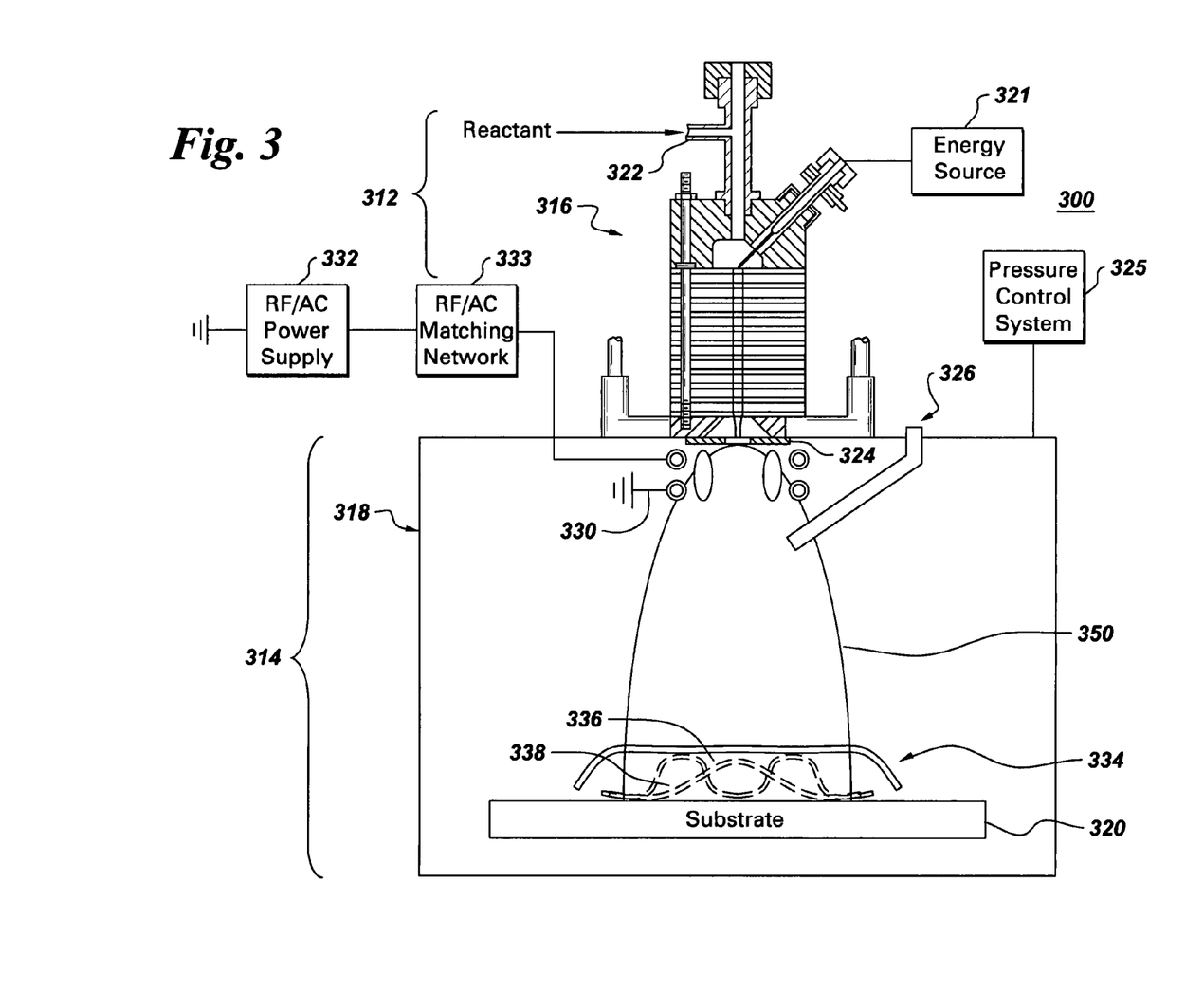
FIG. 3 is a schematic diagram of a plasma source system in accordance with the invention.

A first embodiment of an exemplary ETP-ICP reactor 300 configured for generating an expanding thermal plasma and inductively coupling the generated ETP according to the invention is shown schematically in FIG. 3. The ETP-ICP reactor 300 includes an upstream portion 312 and a downstream portion 314, where the upstream portion 312 includes a plasma-generator 316, and the downstream portion 314 includes a chamber 318. A substrate 320 is mounted in communication with the chamber 318, and may be mounted within the chamber 318. The ETP-ICP reactor 300 receives at least one of a reactant and a reagent which is processed within the ETP-ICP reactor 300 for treating the substrate.

Similar to the ETP reactor 10 shown in FIG. 1, the plasma-generator 316 receives a reactant, such as Argon, Helium, other noble gases, Nitrogen and/or Hydrogen gas, through a port 322 such as a ring injector, a nozzle injector, a flash evaporator, a shower head or another type of inlet. Energy is applied to the plasma generator via an energy source 321. For example, the energy applied may be in the form of radio frequency (RF) energy, microwaves, direct electrical current or voltage, or alternating electrical current or voltage, such as for producing arcs and/or discharges within the plasma-generator 316. The energy applied may be of direct current form or have a continuous or pulsed waveform, where parameters of the waveform, such as waveform type (sinusoidal, square, triangular, trapezoidal, etc.); frequency; duty cycle; etc., are selected for obtaining the desired result. The arcs and/or discharges act upon the reactant to produce a plasma.

Pressure is maintained within the plasma-generator 316 that is suitable for producing a thermal plasma. For example, the pressure may be maintained at near atmospheric pressures or atmospheric pressure, such as>100 Torr. In an exemplary plasma-generator, ions and electrons of the thermal plasma have a temperature of 1 eV, and the charge density is $10^{15}$ cm$^{-3}$. The plasma-generator 316 is further provided with a nozzle through which the thermal plasma exits the plasma-generator 316 for passing through an inlet 324 and then into the chamber 318.

The ETP-ICP reactor 300 differs from the ETP reactor 10 of FIG. 1 in that the chamber 318 is provided with an inductively coupling (IC) system 330. The I/C system 330 includes an apparatus for generating an electromagnetic force, such as at least one electric coil, and a power source for energizing the apparatus, such as by supplying electrical energy of continuous or pulsed waveform, where parameters of the waveform, such as waveform type (sinusoidal, square, triangular, trapezoidal, etc.); frequency; duty cycle; etc., are selected for obtaining the desired result.

The chamber 318 is maintained at a pressure that is lower than the pressure maintained in the plasma-generator 316 for allowing the thermal plasma to expand into an expanding thermal plasma. In the example provided, the pressure maintained in the chamber 318 is 20–200 mTorr and the expansion occurs supersonically. In the chamber 318 the ETP cools rapidly and the electrons and ions start to recombine, after which the expansion shocks. In the I/C ETP 350, as a result of the inductive coupling of electrical power into the expanding thermal plasma, the Te drops less than in the ETP reactor of FIG. 1, and thus will be larger than 0.1–0.3 eV, and the charge density is around $10^{12}$ cm$^{-3}$ or larger.

A reagent such as a material formed of gas, liquid and/or solids, e.g., silanes, methanes, other hydrocarbons, fluorocarbons, deuterated carbons, deuterated silanes, alcohols, acrylates, epoxies, organosilanes, chlorosilanes, fluorosilanes, aminosilanes, organosilicones, metal organic precursors, metal chlorides, metal fluorides, water, oxygen, hydrogen, nitrogen, ammonia, carbon dioxide, carbon monoxide, or a suitable combination thereof, is injected into the chamber 318 via a port, such as injection inlet 326, thus causing dissociation to occur both through charge exchange and subsequent dissociative recombination reactions between the reactant ions and the reagent, and through electron impact dissociation reactions between the inductively heated electrons and the reagent.

The apparatus for generating the electromagnetic force may be provided within the chamber 318, integrated within walls of the chamber 318 or provided outside of the walls of the chamber 318. For example, the apparatus may include at least one free standing insulated electric coil supported by a dielectric support, integrated within walls of the chamber 318 or wound around the walls of the chamber 318. Typically, a portion of a wall of the chamber 318 or other surface with which the at least one coil is in contact (particularly when the at least one coil is not insulated) is formed of a dielectric material. Other portions of walls of the chamber may be formed of dielectric or conductive materials.

One end of the at least one coil is typically connected to ground, and the other to a power source, such as RF/AC power supply 332 and RF/AC matching network 333. Energy, such as electric or RF energy is applied to the at least one coil causing an inductive coupling effect on the I/C ETP 350. Typically, when operating in a start-up mode, energy is applied to the at least one coil once the thermal plasma enters the chamber 318, after which energy is applied to the apparatus as the thermal plasma flows into the chamber 318, although other energy application timing schedules may be used. The energy applied may have a continuous or pulsed waveform, where parameters of the waveform, such as waveform type (sinusoidal, square, triangular, trapezoidal, etc.); frequency; duty cycle; etc., are selected for obtaining the desired results.

The inductive coupling effect causes precursor dissociation to occur through an electron impact dissociation path (in addition to the charge exchange followed by dissociative recombination reactions that occur in a regular ETP) generating a flux of reactive species, and the Te of at least a portion of electrons in the plasma to be raised to a relatively high Te. Once affected by the inductive coupling, the I/C ETP 350 becomes a non-equilibrium plasma, wherein the ion temperature and the electron temperatures may vary relative to one another.

Accordingly, the Te is not completely limited by the ion temperature, and is able to rise, even when the ion temperature does not. Application of energy to the I/C system 330 changes the electric field, causing movement of electrons, increasing the kinetic energy of the electrons and increasing Te. The heavier ions do not react to the changed electric field. Thus, the kinetic energy and temperature of electrons in the chamber 318 are increased without changing the energy level or temperature of ions in the chamber 318.

In a conventional ETP reactor, the thermal plasma rapidly cools in the chamber and electrons loose energy based on the expansion, and are not effective in electron impact dissociation reactions. Further, once recombination begins at least a portion of the electrons and ions are lost. In the apparatus shown by FIG. 3, activation of the added I/C system 330 causes the electrons to heat up without heating the heavier ions. A spectrum of Tes is generated including relatively low Tes, such as approximately equal to 0.1 eV and relatively high Tes greater than 1 eV. The Te spectrum generated typically includes a Te of 0.3 eV having highly useful properties for generating more electrons, ions and thus plasma.

First and second sets of chemical species are generated via the dissociative recombination path and the electron impact dissociation path, respectively. The dissociation products are transported along with the expansion at high drift velocity, thus generating a convective flux of reactive species, which arrives at the surface of the substrate 320, resulting in deposition of a coating 334 on the substrate 320.

Furthermore, the increase in heat causes ionization to occur again, and results in an increase in ion density relative to an ETP only plasma. Accordingly, the increase in Te is proportional to increased ion density. Furthermore, the increase in Te provides the ability to do non-equilibrium chemistry, and to perform high temperature chemistry on a low temperature substrate.

A further advantage to the increased Te is that an increased sheath voltage is built in front of the substrate that the I/C ETP 350 is in contact with as a result of "Child's Law". Ions impacting the substrate are accelerated across this sheath due to the increased voltage. Accordingly, ion acceleration and bombardment energy are increased, which causes increased penetration and implantation of ions into the substrate 320 to form a mixed interface between the substrate 320 and the coating 334 being deposited for providing increased adhesion of the coating 334 to the substrate 320. If porous openings exist in the coating 334 as it is being deposited, ion bombardment fills in the openings, producing a higher density coating.

In an embodiment of the invention, the at least one electric coil of the I/C system 330 includes at least one coil having at least one turn that is mounted strategically in a substantially annular formation within the chamber 318 for applying an off axis, substantially annular bias to the ion density and the deposition profile, resulting in a substantially annular bias to the deposition density and thickness. The strategic placement of the at least one electric coil 330 provides for compensation for the Gaussian distribution of the deposition profile obtained with I/C ETP 350.

Deposition profiles 336 (corresponding to the deposition profile for coating 34 shown in FIG. 1) for a coating produced by an ETP only plasma, and 338 (corresponding to the deposition profile for coating 224 shown in FIG. 2) for a coating produced by an ICP only plasma are shown schematically by dotted lines. Coating 334 has a profile that is a combined deposition profile resulting from the Gaussian distribution ion density of the I/C ETP 350 combined with the off-axis high ion distribution effect of the I/C system 330. The combined deposition profile of coating 334 is substantially uniform, resulting in substantially uniform density and thickness of the coating 334 on the substrate 320, as is schematically shown in FIG. 3.

Parameters of the ETP-ICP reactor 300 may be selected and/or controlled to obtain the desired combined deposition profile of coating 334 for achieving deposition uniformity. Exemplary parameters, such as parameters described in "High-rate Deposition of Abrasion Resistant Coatings Using a Dual-source Expanding Thermal Plasma Reactor" by M. Schaepkens, S. Selezneva, P. Moeleker, and C. D. Iacovangelo, J. Vac. Sci. Technol. A21(4), July/August 2003, include downstream operating pressure, working distanced between plasma source and substrate, precursor flow rate into the expanding argon plasma beam, and cathode-to-anode distance in the ETP source. Other parameters may include the amount and type of energy applied to the I/C system 330, configuration of the I/C system 330, strategic placement of the I/C system 330, the number of coils and windings used for the at least one coil. For example, a larger number of turns yields a higher change in density of ions and a higher electron temperature.

Figure 4:
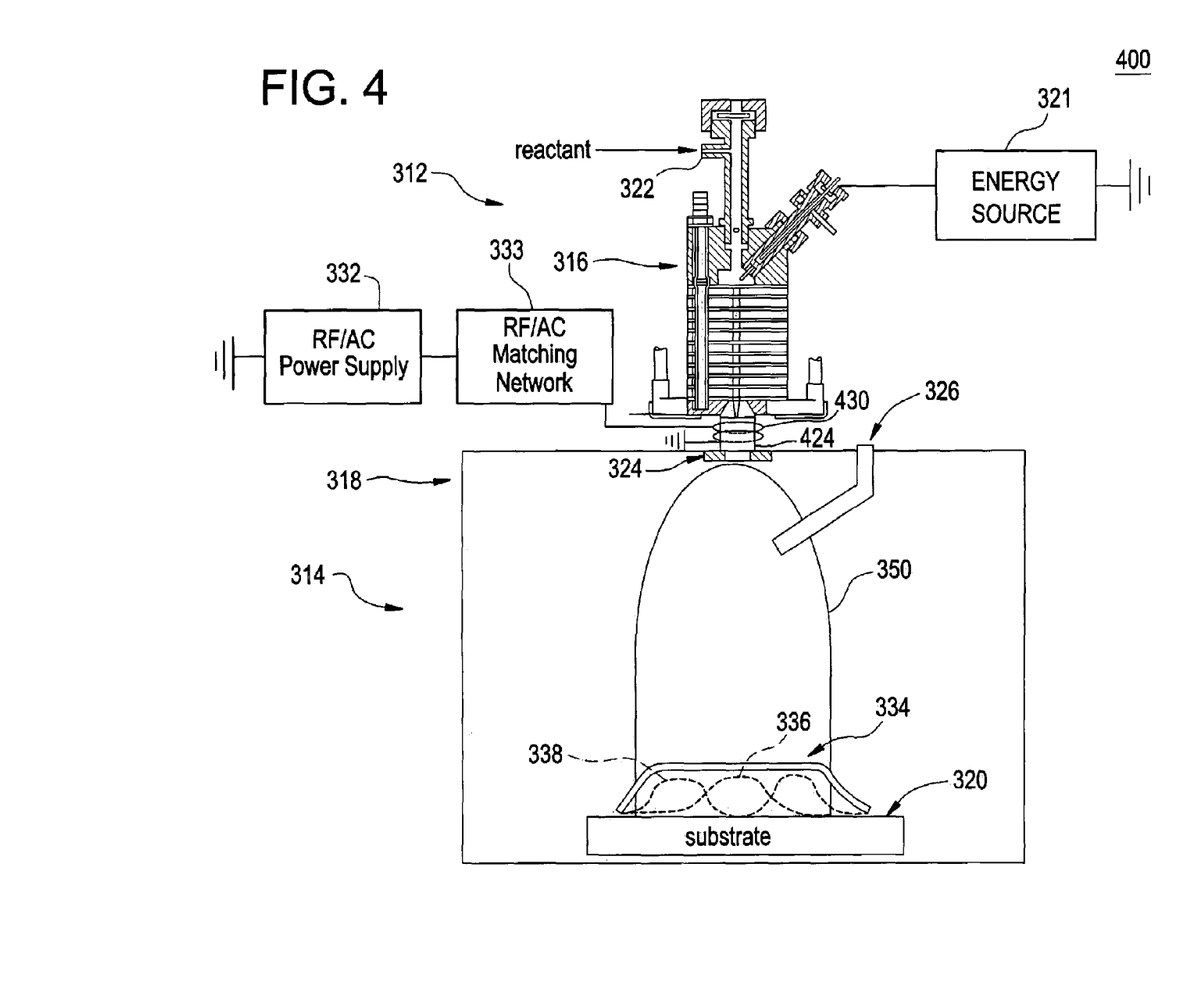
FIG. 4 is a schematic diagram of a plasma source system in accordance with another embodiment of the invention.

FIG. 4 shows an ETP-ICP reactor 400 that is substantially the same as the ETP-ICP reactor 300 shown in FIG. 3, except that an I/C system 430 is positioned along inlet 424, i.e., along the path of the thermal plasma and proximate the thermal plasma as it flows to chamber 318. I/C system 330 (not shown) may also be included.

The I/C system 430 includes an apparatus for generating an electro-magnetic force, such as at least one coil, and a power source for energizing the apparatus. In the embodiment shown, the at least one coil is wound around an outer surface of the inlet 424, so that plasma passes through the at least one coil before entering the chamber 318. The at least one coil 430 may further (or alternatively) be disposed within the inlet 424, such as insulated and positioned within the inlet 424 and/or wound along an inner wall of the inlet 424. Typically, a portion of a wall of the inlet 424 or other surface with which the at least one coil is in contact (particularly when the at least one coil is not insulated) is formed of a dielectric material. Other portions of walls of the inlet 424 may be formed of dielectric or conductive materials.

One end of each coil is typically connected to ground, and the other to a power source, such as RF/AC power supply 332 and RF/AC matching network 333. Electric or RF energy is applied to the at least one coil causing an inductive coupling effect on the I/C ETP 350. Other configurations for the I/C system 430 are envisioned. For example, the apparatus for generating the electromagnetic force may be integrated within the inlet 424.

The I/C ETP 350 generated by the ETP-ICP reactors 300 and 400 according to the disclosure are particularly useful for thin film deposition on surfaces for a large variety of applications, including surface glazing in the automotive, transportation, architectural glass replacement, semiconductor, photovoltaics, optical media, flat panel display and lighting industries. An array of ETP-ICP reactors may be used to achieve a uniform deposition profile using a high density plasma to uniformly provide functional coatings for large surface areas of surfaces formed of glass, metal, silicon and plastic (including polycarbonates). Examples of functional coatings that can be applied to the surface are abrasion resistant coatings, moisture and/or oxygen barrier coatings, ultraviolet absorbing coatings, infrared reflecting coatings and/or other transparent optical coatings (e.g., coatings that have more than 20% light transmission in the 400 nm to 700 nm range).

The I/C ETP 350 may further be used for other applications including treating a surface to etch, roughen, heat and/or clean the surface. In certain cases of this application it is not required to inject a reagent into the expanding inductively coupled plasma, but instead the ionized reactant gas may be used.

The described embodiments of the present disclosure are intended to be illustrative rather than restrictive, and are not intended to represent every embodiment of the present disclosure. Various modifications and variations can be made without departing from the spirit or scope of the present disclosure as set forth in the following claims both literally and in equivalents recognized in law.

What is claimed is:

1. A method for generating plasma using a plasma generator system, said method comprising the steps of:
   introducing energy and a reactant to a plasma generation apparatus of the plasma generator system for generating plasma;
   receiving the generated plasma in a plasma treatment chamber;
   expanding and inductively coupling the generated plasma, wherein the step of inductively coupling comprises the steps of providing at least one electric coil in proximity to the generated plasma and energizing the at least one electric coil;
   providing a substrate having at least one surface;
   using the expanded and inductively coupled plasma to coat the surface of the substrate with at least one coating having a particular configuration; and
   positioning the at least one electric coil in a particular configuration for generating a particular deposition profile corresponding to the particular configuration for the at least one coating on the surface of the substrate.

2. The method according to claim 1, wherein the particular configuration of the at least one electric coil is a substantially annular configuration.

3. The method according to claim 1, wherein the plasma is used to treat a surface for treatment selected from the group of treatments consisting of etching, roughening, hearing, cleaning, and applying a coating to the surface.

4. The method according to claim 1, further including the step of introducing a reagent into the generated plasma.

5. The method according to claim 1, further including the step of:
   maintaining a lower pressure in the plasma treatment chamber than in the plasma generation apparatus.

6. The method according to claim 1, wherein the generated plasma is a thermal plasma.

7. A plasma generation system comprising:
   a plasma generation apparatus for generating thermal plasma;
   a plasma treatment chamber external to said plasma generation apparatus receiving the thermal plasma from the plasma generation apparatus;
   a pressure control system for maintaining a lower pressure in the plasma treatment chamber than in the plasma generation apparatus during plasma generation for causing the thermal plasma to expand within the plasma treatment chamber; and
   an inductor system for inductively coupling the thermal plasma, wherein the inductor system includes at least one electric coil in proximity to the thermal plasma and a power source for energizing the at least one electric coil, wherein the expanded and inductively coupled plasma is directed towards a surface of a substrate within the plasma treatment chamber for coating the surface with at least one coating and wherein the at least one electric coil is positioned within the palsma treatment chamber in a particular configuration for generating a particular deposition profile corresponding to the particular configuration for the at least one coating on the surface of the substrate.

8. The system according to claim 7, wherein the particular configuration of the at least one electric coil is a substantially annular configuration.

9. The system according to claim 7, wherein the expanded and inductively coupled plasma is used to treat a surface for treatment selected from the group of treatments consisting of etching, roughening, heating, cleaning, and applying a coating to the surface.

10. The system according to claim 7, the plasma treatment chamber further comprising a port for receiving a reagent for reacting with the expanded and inductively coupled thermal plasma for dissociation along an electron impact dissaciation path and a dissociative recombination path.

11. A plasma generation system comprising:
    an apparatus for generating a plasma;
    an apparatus for receiving the generated plasma and providing for expansion of the generated plasma; and
    an apparatus for inductively coupling the generated plasma, wherein the apparatus for receiving and the apparatus for inductively coupling together form the generated plasma into an inductively coupled and expanded plasma, wherein the apparatus for inductively coupling the generated plasma includes at least one electric coil in proximity to to the generated plasma, wherein the expanded and inductively coupled plasma is directed towards a surface of a substrate within the apparatus for receiving the generated plasma for coating the surface with at least one coating, and wherein the at least one electric coil is positioned within the apparatus for receiving the generated plasma in a particular configuration for generating a particular deposition profile corresponding to the particular configuration for the at least one coating on the surface of the substrate.

12. The system according to claim 11, wherein the generated plasma is a thermal plasma.

13. A plasma generator system comprising:
    means for generating plasma by introducing energy and a reactant to the plasma generator system;
    means for receiving the generated plasma in a plasma treatment chamber; and
    means for expanding and inductively coupling the generated plasma; wherein the means for inductively coupling the generated plasma comprises at least one electric coil in proximity to the generated plasma and energizing the at least one electric coil using a power source, wherein the expanding inductively coupled plasma is directed towards a surface of a substrate within the plasma treatment chamber for coating the surface with at least one coating and wherein the at least one electric coil is positioned within the plasma treatment chamber in a particular configuration for generating a particular deposition profile corresponding to the particular configuration for the at least one coating on the surface of the substrate.

14. An expanding inductively coupled plasma, said plasma generated by the method comprising the steps of:
    introducing energy and a reactant to a plasma generation apparatus of a plasma generator system for generating plasma;
    receiving a generated plasma in a plasma treatment chamber; and
    expanding and inductively coupling the generated plasma, wherein inductively coupling comprises positioning at least one electric coil in proximity to the generated plasma and energizing the at least one electric coil using a power source, wherein the expanding inductively coupled plasma is directed towards a surface of a substrate within the plasma treatment chamber for coating the surface with at least one coating and wherein the at least one electric coil is positioned within the plasma treatment chamber in a particular configuration for generating a particular deposition profile corresponding to the particular configuration for the at least one coating on the surface of the substrate.

15. An object having at least one surface, the surface treated using an expanding inductively coupled plasma, said plasma generated by the method comprising the steps of:

introducing energy and a reactant to a plasma generation apparatus of a plasma generator system for generating plasma;

receiving a generated plasma in a plasma treatment chamber; and expanding and inductively coupling the generated plasma, wherein inductively coupling comprises positioning at least one electric coil in proximity to the generated plasma and energizing the at least one electric coil using a power source, wherein the expanding inductively coupled plasma is directed towards a surface of the object within the plasma treatment chamber for coating the surface with at least one coating and wherein the at least one electric coil is positioned within the plasma treatment chamber in a particular configuration for generating a particular deposition profile corresponding to the particular configuration for the at least one coating on the surface of the object.

* * * * *